United States Patent
Smith

(10) Patent No.: US 9,337,266 B2
(45) Date of Patent: May 10, 2016

(54) METHODS AND APPARATUSES INCLUDING AN ACTIVE AREA OF A TAP INTERSECTED BY A BOUNDARY OF A WELL

(71) Applicant: Micron Technology, Inc., Boise, ID (US)

(72) Inventor: Michael Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/502,804

(22) Filed: Sep. 30, 2014

(65) Prior Publication Data

US 2016/0093694 A1    Mar. 31, 2016

(51) Int. Cl.
| | |
|---|---|
| *H01L 29/66* | (2006.01) |
| *H01L 29/06* | (2006.01) |
| *H01L 21/265* | (2006.01) |
| *H01L 21/762* | (2006.01) |
| *H01L 29/10* | (2006.01) |
| *H01L 29/36* | (2006.01) |

(52) U.S. Cl.
CPC ...... *H01L 29/0688* (2013.01); *H01L 21/26513* (2013.01); *H01L 21/76224* (2013.01); *H01L 29/1095* (2013.01); *H01L 29/36* (2013.01)

(58) Field of Classification Search
CPC ..... H01L 23/60; H01L 23/62; H01L 27/0266; H01L 27/0288; H01L 27/0248; H01L 27/0255
USPC .......................................... 257/173, 355, 360
See application file for complete search history.

(56) References Cited

U.S. PATENT DOCUMENTS

| | | | |
|---|---|---|---|
| 5,602,404 A * | 2/1997 | Chen et al. | 257/112 |
| 2014/0268451 A1 * | 9/2014 | Van Wijmeersch | 361/56 |

* cited by examiner

*Primary Examiner* — Tan N Tran

(74) *Attorney, Agent, or Firm* — Schwegman Lundberg & Woessner, P.A.

(57) ABSTRACT

Apparatuses and methods are disclosed. One such apparatus includes a well having a first type of conductivity formed within a semiconductor structure having a second type of conductivity. A boundary of the well intersects an active area of a tap to the well.

13 Claims, 8 Drawing Sheets

US 9,337,266 B2

METHODS AND APPARATUSES INCLUDING AN ACTIVE AREA OF A TAP INTERSECTED BY A BOUNDARY OF A WELL

BACKGROUND

Semiconductor structures, such as layers, substrates, wafers and wells, can have a particular type of conductivity (e.g., p-type, n-type). Within that structure, wells having an opposite type of conductivity (e.g., N-wells, P-wells) can be formed. Complementary metal oxide semiconductor (CMOS) devices can be formed using such structures. Such devices can be used as, for example, support circuitry in memory devices.

CMOS devices can typically be formed as relatively low voltage or relatively high voltage devices. For example, the high voltage devices might be biased at voltages greater than 30V while low voltage devices might be biased at voltages less than 5V.

N-wells in a p-type structure form a p-n junction at the interface of the well with the structure. FIG. 1 illustrates a cross-sectional view of a typical p-n junction. This figure shows an N-well 101 formed within a p-type structure 100. An N-well contact 102 is coupled to a heavily doped N+ tap 104 that is formed relatively close to the edge of the well 101 at the illustrated distance 110.

A p-type isolation area 120 can be formed in the semiconductor material that forms the bottom surface of a trench between two taps 104, 105. The isolation area 120 can provide isolation between neighboring n-channel devices.

Biasing a p-n junction at too large of a voltage can cause the junction to breakdown and start conducting. When a voltage is applied to the N-well contact 102 that is greater than the designed breakdown voltage for the device, the p-n junction 130 breaks down at the interface of the p-n junction with the isolation area 120.

There are resulting needs for increasing this breakdown voltage.

DETAILED DESCRIPTION

The breakdown voltage of a device can be increased from typical prior art breakdown voltages by, for example, moving a p-n junction from under an isolation area. This can result in a device having a higher breakdown voltage without increasing the distance taken up by the tap and the well (as compared to the prior art). Thus, the illustrated embodiments do not need to take up any more semiconductor silicon area than typical prior art devices.

The subsequently described conductivities are for purposes of illustration only as the opposite conductivity may be used to create a different semiconductor device. For example, the following describes an embodiment where an N-well is formed within a P-well. In another embodiment, a P-well can be formed within an N-well, for example.

The following reference to lightly doped and heavily doped areas can be defined in relation to each other. In other words, a lightly doped area (e.g., N−) can be more lightly doped in comparison to the more heavily doped area (e.g., N+).

Figure 2:
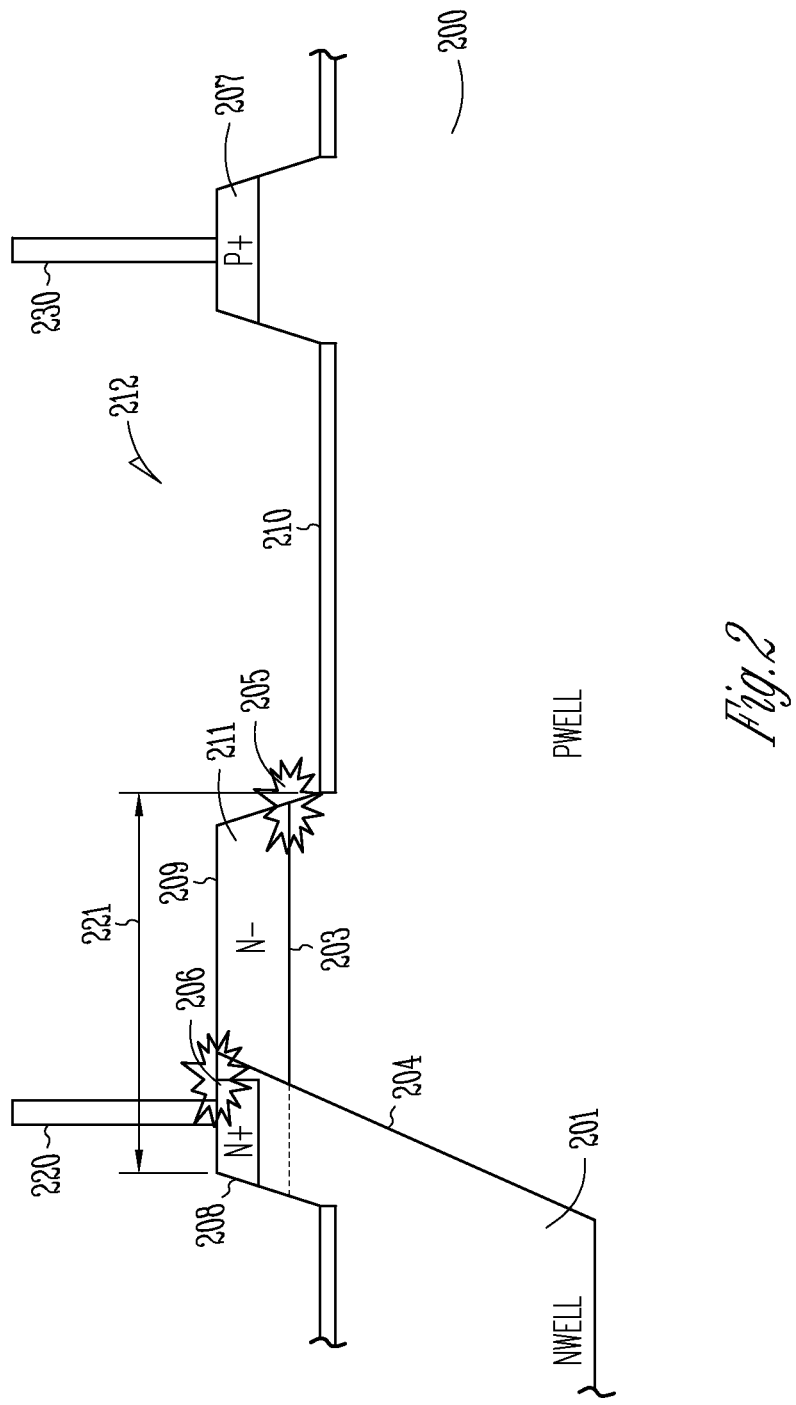
FIG. 2 illustrates a cross-sectional view of an apparatus having a higher breakdown voltage according to various embodiments.

FIG. 2 illustrates a cross-sectional view of an apparatus including a p-n junction according to various embodiments. The apparatus can, for example, include or be part of a diode, transistor, memory support circuitry, etc.

In the embodiment illustrated in FIG. 2, an N-well 201 is formed in a P-well 200 such that a p-n junction having a substantially horizontal component (e.g., along an interface 203 between a lightly doped area 211 (N−) of a tap active area 209 and the P-well 200) and a substantially vertical component (e.g., along an edge 204 of the N-well 201) is formed under the active area 209 of a tap to the N-well 201. As can be seen in FIG. 2, the N-well tap straddles the edge 203 of the N-well 201. For example, the edge 204 of the N-well 201 is within the active area 209 of the tap and the active area 209 of the tap is above both the N-well 201 and the P-well 200.

The active area 209 also includes a more heavily doped area 208 (e.g., N+) over the well 201. A contact 220 is formed over the more heavily doped area 208. The more heavily doped area 208 can serve as an ohmic contact to the N-well 201 such that the contact 220 is electrically coupled to the well. The more heavily doped area 208 may be limited to immediately under the contact 220, and the contact 220 is within the N-well 201 and near an edge of the N-well tap. The contact 220 can be used to apply a voltage to the N-well 201 to properly bias the device for a desired operation.

A substrate tap can include a more heavily doped area (e.g., P+) 207 to which another contact 230 is coupled. A p-type isolation area 210 is formed in the portion of the semiconductor structure 200 that forms a bottom of a trench 212 between the active area 207 of the substrate tap and the active area 209 of the well tap. The isolation area 210 can provide isolation between the two active areas 207, 209.

The more lightly doped area 211 is formed between the contact 220 and the isolation area 210. The space between the contact 220 and an edge of the active area 209 of the tap adjacent to the P-well 200 can be increased over the prior art distances. However, the total distance 221 used by the taps and the N-well 201 may still be approximately the same as that in the prior art.

In the illustrated structure, junction breakdowns can occur at the interface 205 between the more lightly doped area 211 and the P-well 200 at the edge of the active area 209 of the tap adjacent to the P-well 200, as well as at the interface 206 between the N-well 201 and the more heavily doped area 208 near the contact 220. The presence of the N-well 201 may create an electric field peak at the edge 204 of the N-well 201 within the active area 209 of the tap that can further increase the breakdown voltage.

Thus, the structure of FIG. 2 may not use any more silicon area than the typical prior art device while having a higher breakdown voltage. The structure can decouple breakdown voltage from the isolation area 210 so that an implant used to form the isolation area 210 can be optimized (such as for increased n-channel isolation) without significantly affecting the N-well breakdown voltage.

Figure 3:
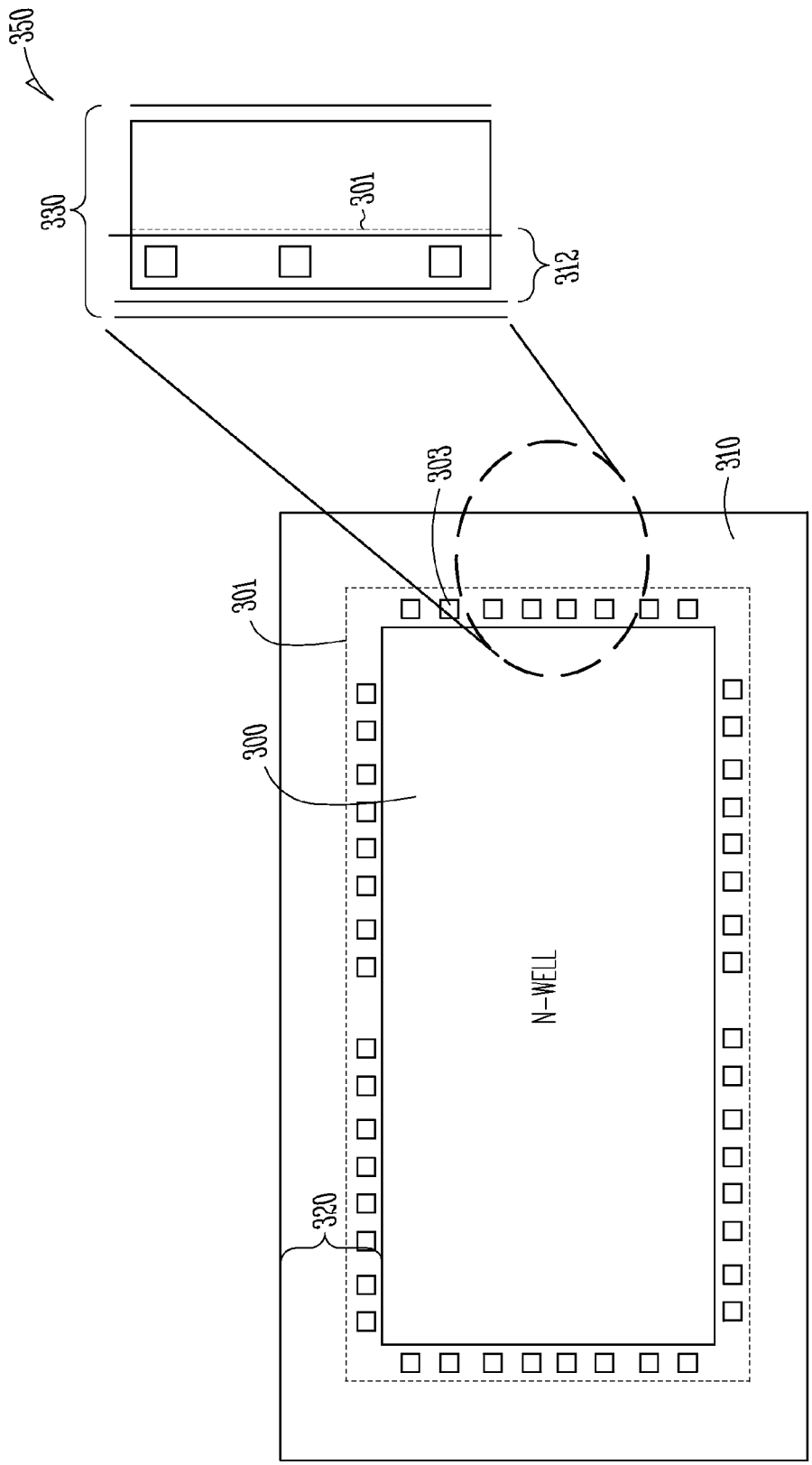
FIG. 3 illustrates a top view of an apparatus in accordance with the embodiment of FIG. 2.

FIG. 3 illustrates a top view of an apparatus including a p-n junction in accordance with the embodiment of FIG. 2. This view shows a N-well 300 formed within a semiconductor structure in the form of a P-well 310. A boundary 301 of the N-well 300 is shown separating the two wells 300, 310 and intersecting an active area 320 of a tap to the N-well 300. The active area 320 of the tap is continuous along the boundary 301 of the N-well 201. Contacts 303 are shown within the boundary 301 of the N-well 300.

The detailed area 350 shows a first area 330 of the apparatus is implanted with a first (e.g., n−) dopant. The first area 330 surrounds a second area 312 that is implanted with a second (e.g., n+ dopant). The second area 312 is within the boundary 301 of the N-well 300. The contacts 303 are coupled to portions of the active area 320 within the second area 312.

Figure 1:
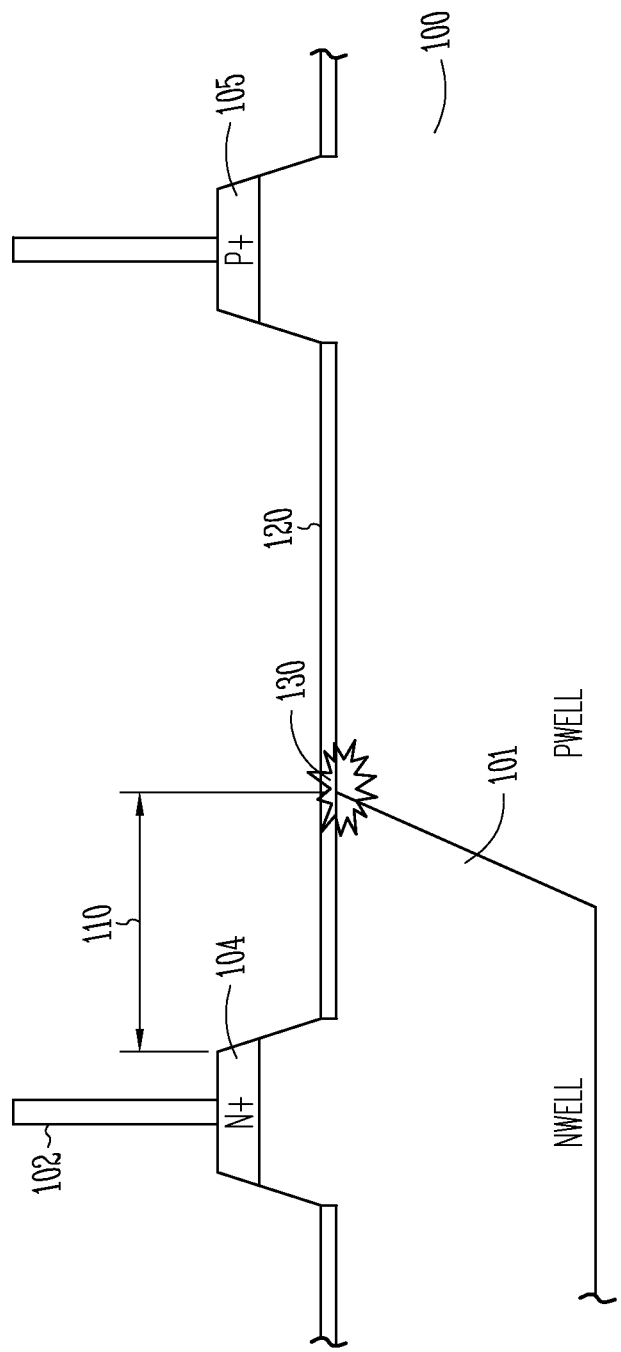
FIG. 1 illustrates a typical prior art cross-sectional view of an apparatus including a p-n junction.

Thus, referring to both FIGS. 2 and 3, the breakdown voltage can be increased from a typical prior art apparatus, such as by moving the active area 209, 320 of a N-well tap such that it is not fully within a boundary 301 of the N-well 201, 300. Relative to the prior art shown in FIG. 1, this increases a distance between the contact 220, 303 and the edge of the active area 209, 320 of the tap adjacent to the P-well 200, 310. Also, a portion of the more lightly doped area (e.g., N−) 211, 330 in the active area 209, 320 separates the more heavily doped area (e.g., N+) 208, 312 under the contact 220, 303 from the edge of the active area 209, 320 of the tap adjacent to the P-well 200, 310.

FIGS. 4-11 illustrate process flow diagrams for fabricating an apparatus including a p-n junction in accordance with an embodiment such as that shown in FIG. 2. These flow diagrams are for purposes of illustration only as other steps can be used to form the apparatus.

Figure 4:
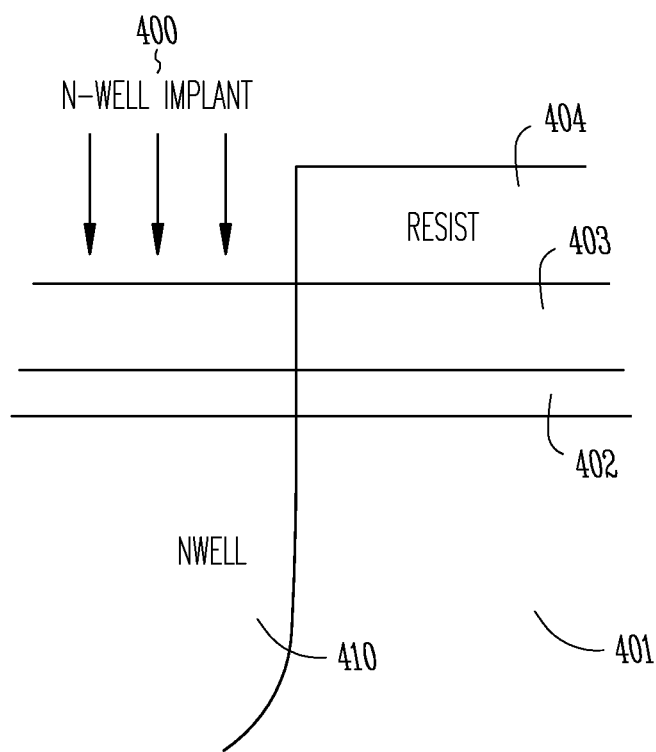
FIGS. 4-11 illustrate process flow diagrams for fabricating an apparatus in accordance with the embodiment of FIG. 2.

Referring to FIG. 4, a gate insulator 402 (e.g., oxide(s), nitride(s), and/or high-K dielectrics) is formed (e.g., grown or deposited) over a substrate 401 (e.g., a p-type silicon substrate). The substrate may be silicon, germanium, III-IV semiconductor (e.g., GaAs) or some other semiconductor material. The substrate 401 may be undoped, p-type doped, or n-type doped and/or may also have any crystal orientation. If the substrate is P-type doped, an Nwell is formed therein. If the substrate is N-type doped, a Pwell is formed. Other embodiments may form one conductivity well within another conductivity well.

The gate insulator 402 may be any dielectric material that may be used in a metal oxide semiconductor (MOS) device, including any combination of materials. In an embodiment, the oxides may be thermally deposited or some other growth/deposition technique may be used.

The gate insulator 402 thickness may vary across the substrate and numerous steps may be involved in producing the multi-insulator thickness substrate (e.g., oxides, wet etches). Thinner insulators (e.g., <70 Å) may be used for lower voltage devices and thicker insulators (e.g., >350 Å) may be used for higher voltage devices. For example, for the edge of the N-well 410, a thinner oxide (e.g., approximately 65 Å) may be used.

Various processes may be used to achieve the gate insulator 402 (e.g., wet etches). For example, a nitride mask may be created to expose areas where a thicker oxide is desired in order to recess the silicon such that the top of the thicker oxide is approximately level with any thinner oxide material.

A polysilicon 403 is formed (e.g. deposited, grown) over the gate insulator 402. The polysilicon 403 may have a thickness in a range of 400 Å-800 Å. The polysilicon 403 may be formed with a dopant incorporated or formed undoped (to be doped later). The polysilicon 403 may also include a silicide on top (e.g., tungsten silicide) or a pure metal (e.g., tungsten) deposited on top of the polysilicon for improved lateral conduction. Pure metal gates may also be used, especially with high-K dielectrics.

Photoresist 404 (e.g., 33 kÅ) may be patterned over the polysilicon 403 and photolithography (e.g., 365 nm) used to expose an area of the substrate 401 in which an N-well 410 is formed. The photoresist 404 may be positive or negative resist and an opening located over the location for the Nwell. The thickness of the photoresist 404 may be enough to screen Nwell implants from penetrating into the non-Nwell areas.

One or more dopants 400 may then be implanted in the area to form the N-well 410. This step may include both shallow and deep implants. N-type dopants may be used to create the Nwell 410. The dopants 400 may also be used to form a p-channel transistor channel that is formed within the Nwell. The dopants 400 may also be used for doping the polysilicon 403. Other implants contributing to any p-channel devices may be performed during other photo steps. Some of those implants may or may not be shared with the tap.

The one or more dopants 400 may include phosphorous or arsenic. For example, phosphorus may be an n-type dopant for deep implants. Arsenic may be an n-type dopant for shallow implants.

Doping technologies may include beamline and plasma doping (PLAD). PLAD may be used for shallow implants (e.g., doping the gate material). Beamline may be done at an angle (e.g., 7°) to avoid channeling (causing a tail of atoms to go too deep into the substrate). Energies may be in the 300 keV-1000 keV energy range. Doses may be in the $10^{13}$ range. Arsenic implants for p-channel may be in $5\times10^{12}/cm^2$ range for lower voltage, less ($5\times10^{11}/cm^2$) for higher voltage. For reversed polarities (Pwell in Nwell), boron beamline may be used for implanting, such as $BF_2$ (molecule with one Boron, two Fluorine) or $B_{11}$ (isotope of Boron with weight of 11). Boron PLAD for poly doping may use a different species such as $B_2H_6$ (diborane molecule) or $BF_3$, for example. Typical doses may be in the $10^{16}$ range. $BF_3$ may use an energy of less than 10 keV.

Other p-type dopants may be implanted in a portion of the substrate 401 adjacent to a bottom surface of a trench away from the N-well 410. These dopants may be spaced away from the yet-to-be formed taps to avoid affecting the breakdown voltage while still being effective as isolation of one N-well 410 from other N-wells or other active areas.

In an embodiment, the p-type implants may occur in their own photo steps. Such photo steps may include photoresist deposition and patterning, implanting, and photo resist removal. Such photo steps may occur in this general portion of the overall flow (e.g., before the trench is formed) although they may also be formed after the trench is formed. Such implants may include deep implants (e.g., for Pwell purposes) and shallow implants (e.g., for n-channel transistors) using boron (e.g., 10 keV-300 keV) having doses in a range of $10^{12}$ to $10^{13}/cm^2$.

Figure 5:
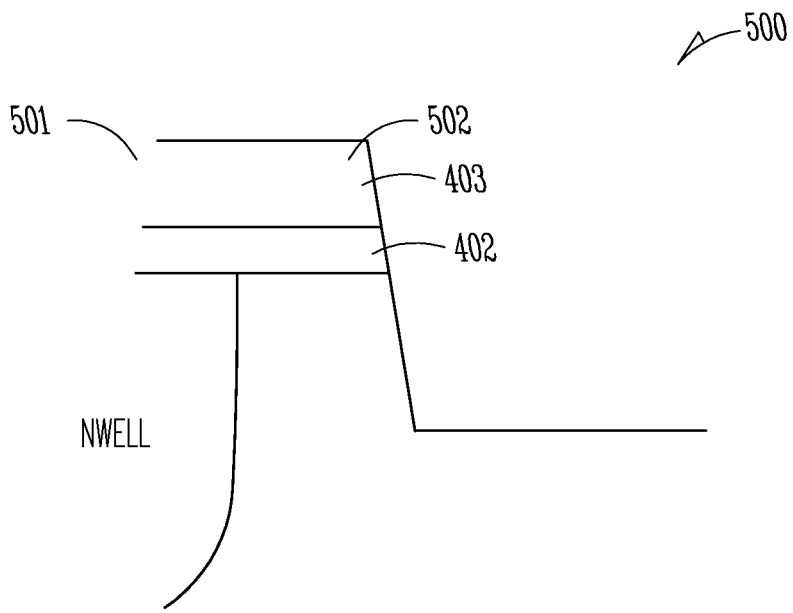

Referring to FIG. 5, a trench 500 is formed (e.g., etched) in the substrate 401 adjacent to the N-well 410 such that a portion of the substrate 401 remains between a side surface of the trench 500 and an edge of the N-well 410. This figure shows the relationship of the N-well 410 with the trench 500, the insulator 402 (e.g., oxide) and the polysilicon 403 over the insulator 402.

The trench may be etched using reactive ion etch (RIE) techniques as opposed to wet chemical etches. The etch process may be more or less non-isotropic (directional) so that, in an embodiment, the sides of the trenches are substantially close to 90°. In another embodiment, the sides may have some slope, such as 45°, and the slope may vary along the depth of the trench. The trench depth may be in a range of 1500 Å to 5000 Å as measured from the silicon substrate surface.

Figure 6:
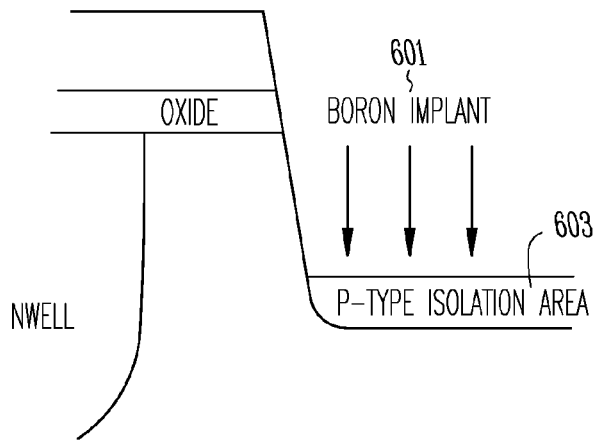

FIG. 6 illustrates a shallow implant of p-type dopants 601 (e.g., boron) in another portion of the substrate 401 adjacent to a bottom surface of the trench 500 to form a p-type isolation area 603. This area may provide isolation of NMOS devices formed in the substrate 401. The above-described dopants (e.g., boron, fluorine, arsenic) and doping technologies (e.g., beamline, PLAD) may be used. This doping may be used for isolation of the Nwells in addition to NMOS devices that may be formed in the Pwells.

Figure 7:
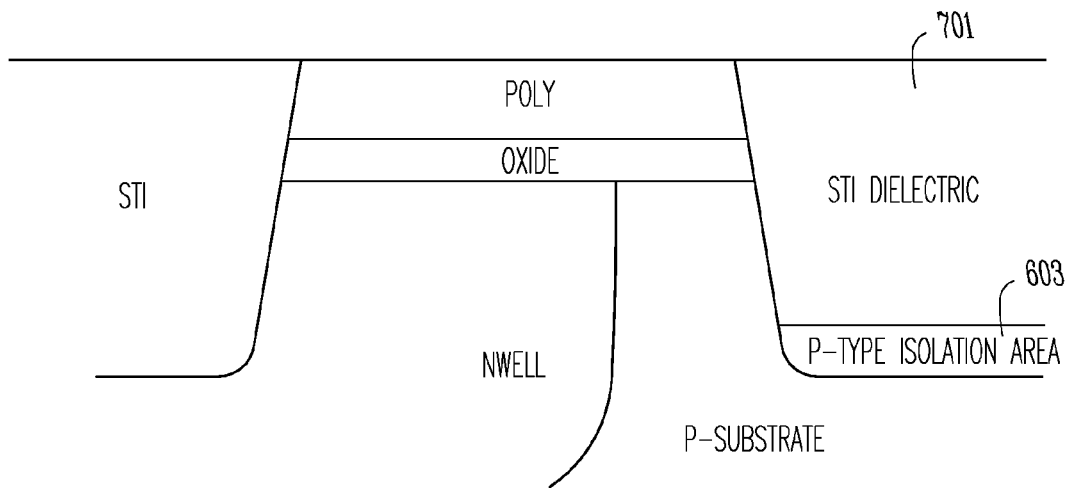

FIG. 7 illustrates a trench fill step and chemical-mechanical planarization (CMP) step. The trench 500 is filled with a dielectric material 701 and a CMP step performed. After the CMP step, a second polysilicon or polysilicide material (not shown) may be deposited over the structure. The dielectric fill material 701 may be silicon oxide and may be performed using various techniques and multiple steps to complete oxide. Fill techniques may include a thermal oxides, deposited oxides (typically CVD), and spin-on-dielectrics (e.g., deposit as liquid then bake hard). A nitride layer may be present in the isolation. The CMP may remove some of the poly so its thickness is less than deposited. The final thickness may be in a range of 500 Å-700 Å.

A number of fabrication steps may occur between the steps of FIG. 7 and the subsequently described steps of FIG. 8. A second conductor may be deposited, and possibly dielectrics formed on top. The second conductor may be polysilicon, silicide, or one or more metals, for example. All are eventually removed above the tap area. The second conductor may be removed near the tap as part of the gate etch wherein the gate of the transistors is patterned using typical photolithography (PL) techniques. PL may be left only in places where a gate is desired, which does not include the tap, so it is exposed during an etch process.

The etch process may be RIE, but may involve multiple steps to remove the gate stack. Portions of the gate oxide may be removed during the etch, depending on selectivity of etch to polysilicon versus oxide. This process may be followed by a thermal oxide (e.g., 5 Å-20 Å thickness) for the purpose of healing damage on the sidewall of the gates of the transistors but may contribute to oxide on the silicon surface.

A separate etch, targeting the STI dielectric, (e.g., to lower it) may be performed. Such an etch may be done between clearing any second poly/conductor and etching the first poly. The poly etch may be non-isotropic to make straight poly sidewalls, but may include a certain isotropic clean-up etch to verify removal of all traces of poly that might be protected by any STI oxide overhang at the edge of the active area.

Figure 8:
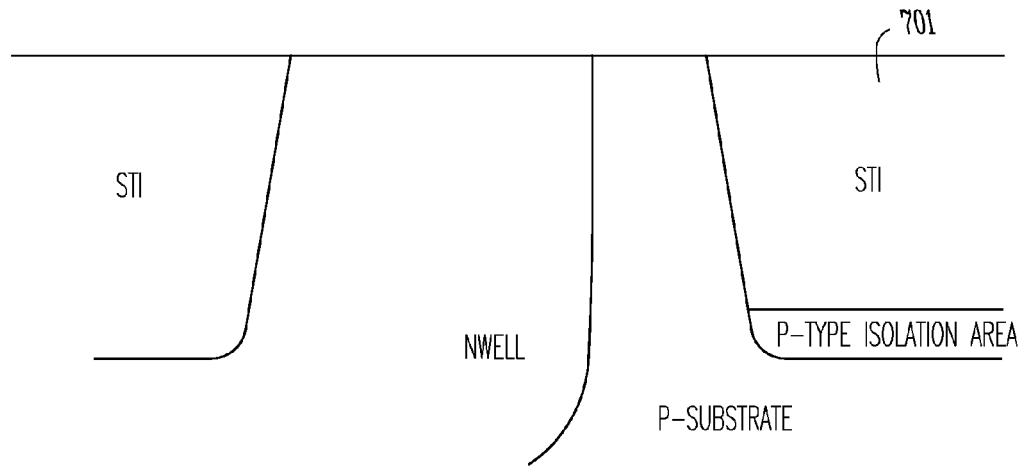

Referring to FIG. 8, the polysilicon 403 and part or all of the gate insulator (e.g., oxide) 402 is removed (e.g., etched). The second polysilicon/polysilicide is also removed at this time.

Figure 9:
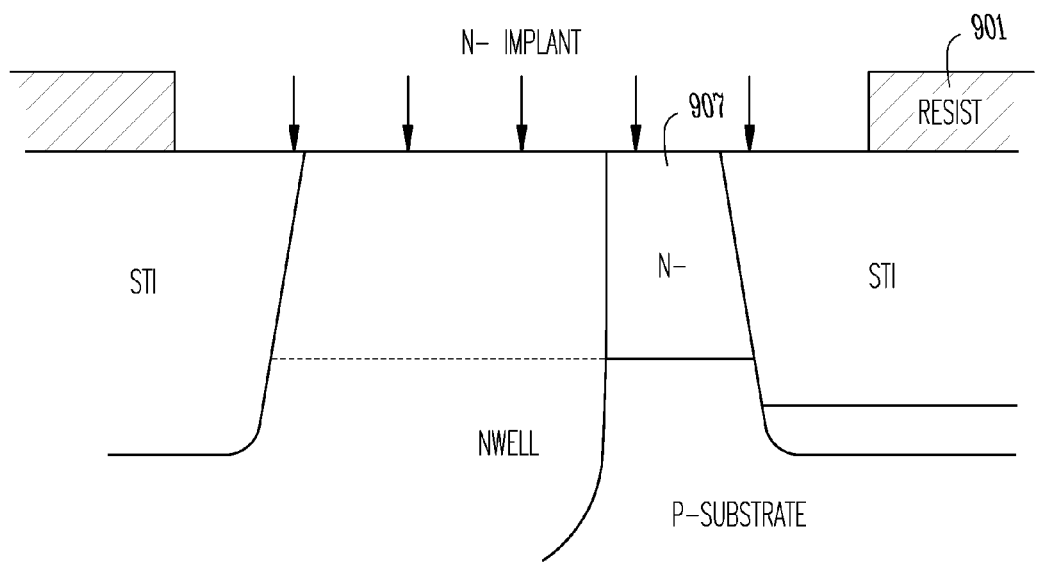

Referring to FIG. 9, a resist material 901 can be patterned on the surface of the structure and a first dopant implanted into the portion the substrate that remains between the side surface of the trench 500 and the edge of the N-well 410 to form a lightly doped area 907 (e.g., N− region).

The dopant may be implanted into the entire exposed area, including the Nwell, but may be relatively lightly doped. The p-type active area exposed between the Nwell and STI edge may be counter-doped to make it N−. Typical implants may include phosphorus (e.g., 10 keV), in a range of $2\times10^{12}$-$7\times10^{12}$/cm². Multiple phosphorus and/or arsenic implants may also be used.

Figure 10:
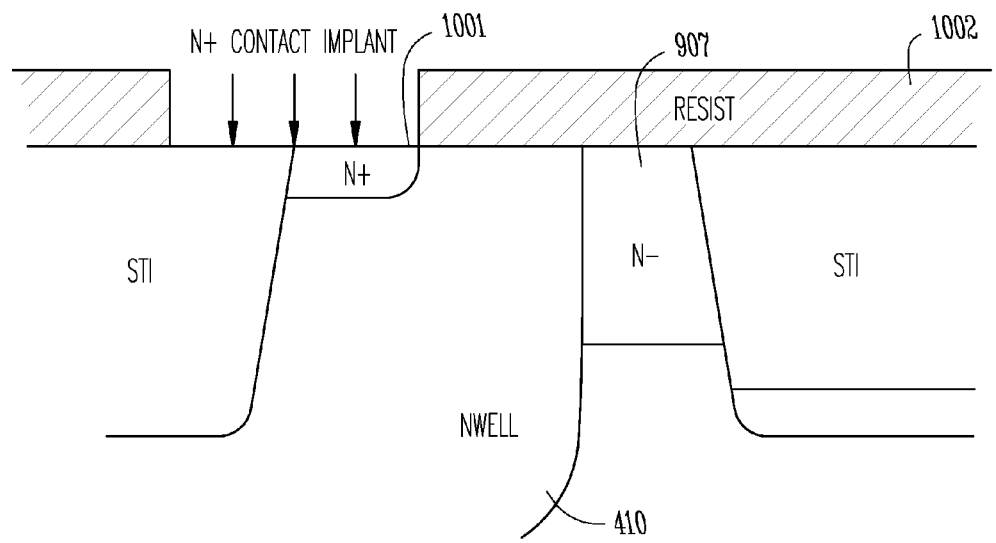

Referring to FIG. 10, another resist material 1002 is patterned on the surface of the structure and a second dopant is implanted in an exposed portion of the N-well 410 to form a heavily doped area 1001. In another embodiment, this step can be performed during the step illustrated in FIG. 11 after the contact hole 1102 is etched, which would allow the heavily doped area (N+) 1001 to be self-aligned.

An opening in the resist material 1002 may extend past an edge of the active area on the inside of the Nwell. This may expose the most inner portion of the active area (as seen in FIG. 9). In an embodiment, a typical amount of active area exposed may be 0.3 μm-1.0 μm.

The heavily doped area 1001 may be n-type. The dopant may be phosphorus, arsenic or a combination. Carbon may be co-implanted to help prevent phosphorus diffusion. Arsenic may be in a range of 20-60 keV with a dose targeting $4\times10^{15}$/cm² but having a range of $2\times10^{15}$ to $6\times10^{15}$/cm²). The same doses may be used for phosphorus+carbon, with a phosphorus energy target of 10 keV and a carbon energy target of 12 keV. The implant may form an ohmic (linear) contact.

Figure 11:
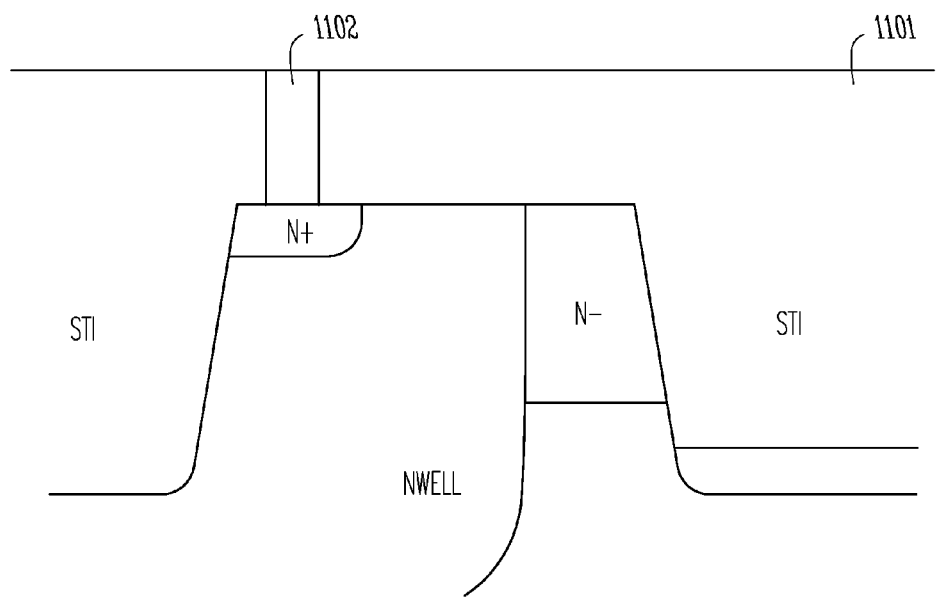

FIG. 11 illustrates an STI dielectric material 1101 being formed over the structure and planarized with a CMP. An etch can be performed to form the contact hole 1102. The contact hole 1102 can be filled with contact material (e.g., metal with various liners). A CMP step may be used to remove the excess dielectric material 1101 to result in the structure of FIG. 2.

The dielectric material 1101 may be silicon dioxide, BPSG, or other types of oxides used for the STI. Heat steps may be included for densification. Multiple steps may be used, including nitride layers. For example, a 50 Å thick nitride layer 200 Å above the silicon may be used. Also, a nitride layer may be used at the top of this oxide layer as part of contact and subsequent metal conductor formation. Nitride layers may be in a range of 50 Å to 200 Å and may be used as barrier layers rather than the bulk of the fill. A typical total thickness in a range of 1000 Å to 5000 Å may be used.

The etch may use another photo layer to expose the area to be etched. A typical RIE directional etch may be used to make contact holes with nearly vertical sides. The etch may be down to silicon to expose the N+ Region. The hole may be more or less centered over N+ region. In an embodiment, a typical width dimension of the contact hole may be 100 nm.

While not explicitly stated above, it is assumed that the different levels of etch resist discussed previously are eventually removed. The resist may be removed prior to the next step in the flow.

Figure 12:
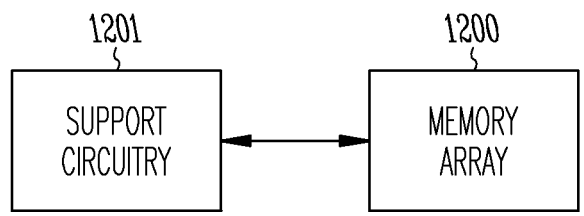
FIG. 12 illustrates a block diagram of a memory device including a device in accordance with the embodiment of FIG. 2.

FIG. 12 illustrates a block diagram of an apparatus in accordance with the embodiment of FIG. 2. The apparatus can include a memory array 1200 that includes memory cells (e.g., flash, dynamic random access memory DRAM). The memory array 1200 is coupled to support circuitry 1201 that can provide support functions like power switching or bus drivers. In an embodiment, this circuitry 1201 can include CMOS type devices. The support circuitry 1201 can include semiconductor devices (e.g., transistors, diodes) that can use the apparatus of FIG. 2.

As used herein, an apparatus may refer to, for example, circuitry, an integrated circuit die, a memory device, a memory array, or a system including such a circuit, die, device or array (e.g., a memory device coupled to a processor).

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. An apparatus comprising:
   a well having a first type of conductivity formed within a semiconductor structure having a second type of conductivity; and
   a tap to the well, wherein a boundary of the well between the well and the semiconductor structure intersects an active area of the tap such that the boundary occurs within the active area and the boundary separates a first doped area of the active area from a second doped area of the active area, wherein the second doped area is more heavily doped than the first doped area with a same conductivity dopant.

2. The apparatus of claim 1, wherein the tap straddles the boundary of the well.

3. The apparatus of claim 1, further comprising a contact coupled to the active area of the tap, wherein the contact is over the well.

4. The apparatus of claim 1, wherein the second doped area is implanted with a n+ dopant and the first doped area is implanted with a n− dopant.

5. The apparatus of claim 1, wherein a p-n junction formed by the well and the semiconductor structure has a substantially vertical junction and a substantially horizontal junction.

6. The apparatus of claim 1, wherein the active area of the tap is continuous along the boundary of the well.

7. A method for forming an apparatus, the method comprising:
   forming a well having a first type of conductivity within a semiconductor structure having a second type of conductivity; and
   forming a tap to the well comprising an active area such that a boundary of the well between the well and the semiconductor structure intersects the active area of the tap wherein the boundary occurs within the active area and the boundary separates a first doped area of the active area from a second doped area of the active area, wherein the second doped area is more heavily doped than the first doped area with a same conductivity dopant.

8. The method of claim 7, further comprising forming a trench in the semiconductor structure, wherein a portion of the semiconductor structure remains between a side surface of the trench and an edge of the well.

9. The method of claim 8, further comprising filling the trench with a dielectric material.

10. The method of claim 9, further comprising implanting an exposed portion of the well with another dopant to form an area that is more heavily doped than a remaining portion of the well.

11. The method of claim 8, wherein forming the tap comprises implanting the portion of the semiconductor structure that remains between the side surface of the trench and the edge of the well with a dopant.

12. The method of claim 11, further comprising forming a contact on the area that is more heavily doped than the remaining portion of the well.

13. The method of claim 8, further comprising implanting a dopant into another portion of the semiconductor structure adjacent to a bottom surface of the trench to form an isolation area.

* * * * *